(12) United States Patent
Wallace et al.

(10) Patent No.: US 9,142,421 B2
(45) Date of Patent: Sep. 22, 2015

(54) DOUBLE PATTERNING LITHOGRAPHY TECHNIQUES

(75) Inventors: Charles H. Wallace, Portland, OR (US); Swaminathan Sivakumar, Portland, OR (US); Matthew L. Tingey, Hillsboro, OR (US); Chanaka D. Munasinghe, Hillsboro, OR (US); Nadia M. Rahhal-Orabi, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 37 days.

(21) Appl. No.: 13/976,090

(22) PCT Filed: Dec. 29, 2011

(86) PCT No.: PCT/US2011/067929
§ 371 (c)(1),
(2), (4) Date: Jun. 26, 2013

(87) PCT Pub. No.: WO2013/101107
PCT Pub. Date: Jul. 4, 2013

(65) Prior Publication Data
US 2014/0017899 A1    Jan. 16, 2014

(51) Int. Cl.
*H01L 21/469* (2006.01)
*H01L 21/308* (2006.01)
*H01L 21/033* (2006.01)

(52) U.S. Cl.
CPC ........ *H01L 21/3088* (2013.01); *H01L 21/0337* (2013.01)

(58) Field of Classification Search
CPC ..................... H01L 21/31111; H01L 21/0273; G03F 7/0035

USPC .................................................. 430/317, 319
See application file for complete search history.

(56) References Cited

U.S. PATENT DOCUMENTS

| 2007/0287101 A1 | 12/2007 | Kim et al. |
| 2010/0068656 A1 | 3/2010 | Yeh et al. |
| 2010/0227276 A1 | 9/2010 | Mizuno |

FOREIGN PATENT DOCUMENTS

| KR | 10-2009-0097765 A | 9/2009 |
| WO | 2013/101107 A1 | 7/2013 |

OTHER PUBLICATIONS

International Search Report and Written Opinion received for PCT Patent Application No. PCT/US2011/067929, mailed on Sep. 19, 2012, 14 Pages.

*Primary Examiner* — Daborah Chacko Davis
(74) *Attorney, Agent, or Firm* — Finch & Maloney PLLC (57) ABSTRACT

Techniques are disclosed for double patterning of a lithographic feature using a barrier layer between the pattern layers. In some cases, the techniques may be implemented with double patterning of a one- or two-dimensional photolithographic feature, for example. In some embodiments, the barrier layer is deposited to protect a first photoresist pattern prior to application of a second photoresist pattern thereon and/or to tailor (e.g., shrink) one or more of the critical dimensions of a trench, hole, or other etchable geometric feature to be formed in a substrate or other suitable surface via lithographic processes. In some embodiments, the techniques may be implemented to generate/print small features (e.g., less than or equal to about 100 nm) including one- and two-dimensional features/structures of varying complexity.

25 Claims, 8 Drawing Sheets

DOUBLE PATTERNING LITHOGRAPHY TECHNIQUES

BACKGROUND

Integrated circuit design in the deep-submicron process nodes (e.g., 45 nm and beyond) involves a number of non-trivial challenges, and circuits incorporating microelectronic components generated via lithographic processes have faced particular complications at these levels, such as those with respect to achieving ever-smaller and more precise device features. Continued process scaling will tend to exacerbate such problems.

DETAILED DESCRIPTION

Techniques are disclosed for double patterning of a lithographic feature using a barrier layer between the pattern layers. In some cases, the techniques may be implemented with double patterning of a one- or two-dimensional photolithographic feature, for example. In some embodiments, the barrier layer is deposited to protect a first photoresist pattern prior to application of a second photoresist pattern thereon and/or to tailor (e.g., shrink) one or more of the critical dimensions of a trench, hole, or other etchable geometric feature to be formed in a substrate or other suitable surface via lithographic processes. In some embodiments, the techniques may be implemented to generate/print small features (e.g., less than or equal to about 100 nm) including one- and two-dimensional features/structures of varying complexity.

General Overview

As previously noted, conventional lithography techniques for use in semiconductor device design are associated with a number of non-trivial issues. For instance, current lithography techniques are reaching the limits of resolution, requiring new methodologies to generate/print feature sizes beyond the 32 nm node. In some cases, features beyond the 32 nm node cannot be generated/printed using single exposure lithography. In addition, conventional techniques are generally susceptible to rounding of corners, blurring of edges, skewing of sidewalls, high mask error enhancement factor, and/or an inability to resolve with tight pitch in two directions.

Thus, and in accordance with an embodiment of the present invention, techniques for double patterning using a barrier layer between patterns are disclosed. In some instances, the disclosed techniques may be implemented to provide an integrated semiconductor device patterning process utilizing, for example, a thin film deposition as the barrier layer. In one or more example embodiments, one- or two-dimensional features (of varying complexity) may be formed by: (1) depositing a first photoresist pattern on a substrate or other suitable surface; (2) depositing a barrier layer on the first photoresist pattern; (3) depositing a second photoresist pattern on the barrier layer; and (4) etching the resultant patterned structure to generate/print trenches, holes, and/or other etchable shapes/features in the substrate or other suitable surface. As will be appreciated in light of this disclosure, the effective etch rate of the combined first photoresist pattern and barrier layer is different from the effective etch rate of the second photoresist pattern. The two patterns can be etched with different etch-types and/or chemistries and at different times. As such, the second pattern can be shrunk or grown without affecting the first pattern, for example.

In some embodiments, a thin film deposition or other barrier layer may be implemented in accordance with the disclosed techniques to protect the dimensional integrity of a first photoresist pattern from chemical and/or physical attack during a subsequent lithography process. For example, in some instances, the barrier layer may be implemented to protect a first photoresist pattern from, for example, solvent, developer, and/or a second exposure during subsequent patterning processes. The barrier layer also may be used to passivate the surface of a first photoresist pattern so that a second photoresist pattern may be disposed thereon without chemically reacting with and/or physically altering the first pattern. In some cases, passivation of the first photoresist pattern may be achieved by, for example, chemical application, plasma etching (e.g., ionized HBr gas), ion implantation, or formation of an impervious thin film. Numerous suitable passivation techniques will be apparent in light of this disclosure.

The barrier layer also may be implemented to augment the effective dimensions and/or effective shape of a first photoresist pattern. For example, in one or more embodiments, a thin film deposition may be implemented to reduce the critical dimension (i.e., minimum feature size) of a first photoresist pattern by adjustment of the applied thickness of the thin film deposition layer. In some such embodiments, this may allow for a (complex) two-dimensional photoresist pattern to be created and may allow for independent control of the critical dimension in terms of etch bias, shrinking, and/or growth on multiple patterning steps. The disclosed techniques may be used in conjunction with other known lithography methods, such as shrinking, freezing, photoresist trimming, line-width roughness reduction, etc., in some embodiments. In some cases, the disclosed techniques may provide for independent control of a feature in the x-direction (i.e., transverse) and/or the y-direction (i.e., longitudinal), with respect to a top-down view.

Methodology

Figure 1A:
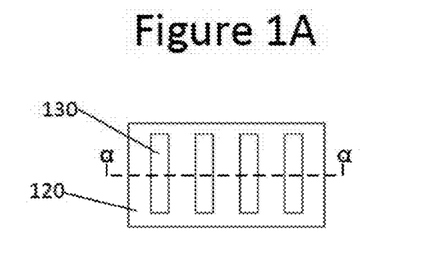
FIG. 1A illustrates a top-down view of an example integrated circuit after forming a first photoresist pattern and configured in accordance with an embodiment of the present invention.
Figure 1B:
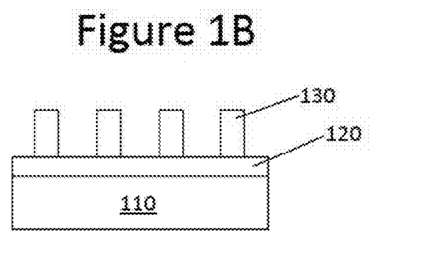
FIG. 1B illustrates a cross-section view of the example integrated circuit of FIG. 1A along dashed line α-α therein.

FIG. 1A illustrates a top-down view of an example integrated circuit after forming a first photoresist pattern 130 and configured in accordance with an embodiment of the present invention. FIG. 1B illustrates a cross-section view of the example integrated circuit of FIG. 1A along dashed line α-α therein.

In one or more embodiments, substrate 110 can be any surface suitable for patterning, including, but not limited to, metal, silicon, germanium, III-V materials, oxide, nitride, combinations thereof, or other suitable semiconductor substrate materials. Substrate 110 may be configured, for example, as a bulk substrate, a semiconductor-on-insulator (XOI, where X is a semiconductor material such as silicon, germanium, or germanium-enriched silicon), or a multi-layered structure. Substrate 110 may be of any given thickness, as desired for a given application. In some specific example instances, substrate 110 may be a semiconductor wafer.

As can be seen, substrate 110 may have disposed thereon, for example, an optional anti-reflective coating 120 and a first patterned photoresist 130. In one or more embodiments, optional anti-reflective coating 120 may be disposed on at least a portion of a surface (or other exposed topography) of substrate 110. The type of anti-reflective coating 120 (if included) can be determined, for instance, by the particular lithographic process being employed and/or the application of the device being formed. In some such embodiments, anti-reflective coating 120 may be, for example, a bottom anti-reflective coating (BARC) or other suitable coating applied to reduce reflection of photolithographic light in the wavelength range of about, for example, 356 nm, 248 nm, 193 nm, or 13 nm (extreme ultraviolet). Anti-reflective coating 120 may be of any desired thickness suitable for its purpose and may be, in some embodiments, in the range of about 200-1000 Å (20-100 nm), for example. Anti-reflective coating 120 may be a single-film or multi-film coating. In some embodiments, anti-reflective coating 120 may be, for example, a carbon-based polymer or a spin-on glass (SOG).

In some embodiments, first photoresist pattern 130 may be patterned on at least a portion of anti-reflective coating 120. First photoresist pattern 130 may be any resist material (e.g., organic, inorganic, molecular, hybrid, etc.) suitable for patterning one or more lithographic features. In some specific example embodiments, first photoresist pattern 130 may be a polymer, such as, but not limited to, poly(methyl methacrylate) (PMMA), poly(dimethyl glutarimide) (PMGI), phenol formaldehyde (PF) resin, or SU-8. In some embodiments, the first photoresist pattern 130 may be a material having a melting point (e.g., a glass transition temperature, $T_g$) in the range of about 150-180° C., for example, though higher or lower melting points (based on the actual material used) will be apparent in light of this disclosure and the claimed invention is not intended to be limited to the example range provided. First photoresist pattern 130 may be of any desired dimensions, depending on the feature to be formed in substrate 110 or other suitable surface. First photoresist pattern 130 may be patterned using any suitable deposition and lithography methods, as will be apparent in light of this disclosure. In some embodiments, the choice of material for first photoresist pattern 130 may be made, in part, based on optimally matching the topography on which it will be patterned (e.g., substrate, anti-reflective coating, etc.).

Figure 2A:
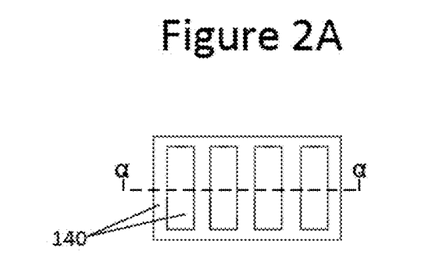
FIG. 2A illustrates a top-down view of the example integrated circuit of FIG. 1A after forming a barrier layer thereon and configured in accordance with an embodiment of the present invention.
Figure 2B:
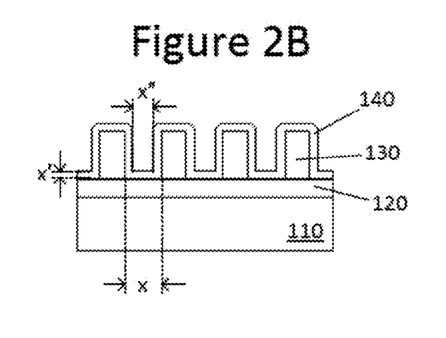
FIG. 2B illustrates a cross-section view of the example integrated circuit of FIG. 2A along dashed line α-α therein.

FIG. 2A illustrates a top-down view of the example integrated circuit of FIG. 1A after forming a barrier layer 140 thereon and configured in accordance with an embodiment of the present invention. FIG. 2B illustrates a cross-section view of the example integrated circuit of FIG. 2A along dashed line α-α therein. As can be seen, the barrier layer 140 may be disposed on at least a portion of the surface (or other exposed topography) resulting from the deposition of the first photoresist pattern 130 (and optional anti-reflective coating 120, when included) on substrate 110 or other suitable surface. In some embodiments, barrier layer 140 may be an inorganic material and/or dielectric material such as, but not limited to, a carbide, oxide, or nitride. In some specific such embodiments, for example, barrier layer 140 is an oxide such as, but not limited to, silicon oxide or silicon dioxide, germanium oxide, silicon-germanium (SiGe) oxide, III-V material oxide, or titanium oxide. In a more general sense, the barrier layer 140 material can be selected to provide the various desired qualities as described herein, as will be discussed in turn.

As discussed above, in some embodiments, barrier layer 140 may serve to protect and preserve the dimensional integrity of an underlying first photoresist pattern 130 during, for example, subsequent lithographic processing in double patterning (e.g., deposition of a second or more photoresist patterns thereon). Furthermore, in some embodiments, barrier layer 140 may assist with forming two-dimensional features/structures (of varying complexity) on a given substrate 110 or other suitable surface. Further still, in some embodiments, barrier layer 140 may serve to tailor the critical dimensions of a given feature to be etched into substrate 110 or other suitable surface.

Several factors may be considered in choosing a material that is suitable for barrier layer 140 for use in a multiple (e.g., double) patterning process, in accordance with one or more embodiments of the present invention. For instance, in some specific example embodiments, it may be desirable to implement a barrier layer 140 which fulfills one or more or all of the following four conditions.

First, in some cases, it may be desirable to implement a barrier layer 140 that serves as a chemically and/or physically protective barrier for the given underlying photoresist pattern 130. In some instances, such a barrier layer 140 may be disposed, in part or in whole, on a surface or other exposed topography of a first photoresist pattern 130. In one or more such embodiments, the barrier layer 140 protects the first photoresist pattern 130 (e.g., a polymer) against chemical attack from chemicals typically used in lithography patterning processes such as, for example: water; ethyl lactate ($C_5H_{10}O_3$); propylene glycol methyl ether acetate (PGMEA) ($C_6H_{12}O_3$); propylene glycol monomethyl ether (PGME) ($C_4H_{10}O_2$); cyclohexanone ($C_6H_{10}O$); hexamethyldisalizane (HMDS) (($CH_3$)$_3$Si—NH—Si($CH_3$)$_3$); and tetra-methyl ammonium hydroxide (TMAH) (($CH_3$)$_4$NOH). Also, it may be desirable to provide a barrier layer 140 which can be double exposed. In cases where the barrier layer 140 is very thin (e.g., less than about 30 Å) and/or of sufficiently high porosity, such a layer 140 may not provide a sufficient chemical barrier to one or more of the above-listed chemicals or other chemicals present in a multiple patterning process. In some such instances, the barrier layer 140 may be implemented in conjunction with one or more supplemental protection processes, as may be desirable for a given application. For example, some such supplemental protection processes may include, but are not necessarily limited to, chemical treatment, physical layering, ion implantation, and plasma treatment. Other suitable supplemental protection processes that may be used in conjunction with a very thin and/or highly porous barrier layer 140 will be apparent in light of this disclosure.

Second, in some cases, it generally may be desirable to implement a barrier layer 140 without substantially changing the profile, sidewall angle, footing, and/or top-rounding of the first photoresist pattern 130. However, in other instances, a change in the sidewall profile or other characteristics of the first photoresist pattern 130 may be desired, and thus, in accordance with an embodiment of the present invention, the profile may be tuned by adjusting one or more variables of the deposition process including, for example, the temperature, time, chemistry, and etch-type, to achieve this end.

Third, in some cases, it may be desirable to ensure that the barrier layer 140 disposed, grown, or otherwise formed on a given first photoresist pattern 130 is chemically inert and does not otherwise react or adversely interact with a given second photoresist pattern 150 subsequently disposed thereon (barrier layer 140 should be chemically compatible with the second photoresist material). In some embodiments, the barrier layer 140 on the first photoresist pattern 130 may serve to passivate the surface thereof and thus provide an amenable surface on which to pattern the second photoresist pattern 150.

Fourth, in some cases, it may be desirable to ensure that the barrier layer 140 is deposited, grown, or otherwise formed on the first photoresist pattern 130 at a temperature that is lower than the melting point (e.g., glass transition temperature, $T_g$) of the underlying photoresist material. In some specific example instances, the photoresist may be a polymer or other suitable photoresist material, as previously discussed with reference to FIGS. 1A and 1B, and the material of barrier layer 140 may be chosen accordingly. If the melting point of the first photoresist pattern 130 is exceeded during deposition of barrier layer 140, then the first photoresist pattern 130 will melt and flow, damaging the pattern. Therefore, in accordance with an embodiment of the present invention, it may be desirable to implement a barrier layer 140 of sufficiently low temperature so as to not melt or flow the underlying first photoresist pattern 130, thereby preserving the integrity of the photoresist features/dimensions while simultaneously: (1) providing chemical/physical protection to first photoresist pattern 130 during subsequent lithographic process steps; and/or (2) tailoring the critical dimension of a feature to be formed in a substrate 110 or other suitable surface. For example, in cases where $T_g$ of the first photoresist pattern 130 (e.g., polymer) is about 150° C., a barrier layer 140 may be considered of sufficiently low temperature (and thus avoid melting/flowing the photoresist material) if it is deposited, grown, or otherwise formed on the first photoresist pattern 130 at a temperature that is less than 150° C. (e.g., 90-145° C., or lower). As another example, in cases where $T_g$ of the first photoresist pattern 130 (e.g., polymer) is about 180° C., a barrier layer 140 may be considered of sufficiently low temperature (and thus avoid melting/flowing the photoresist material) if it is deposited, grown, or otherwise formed on the first photoresist pattern 130 at a temperature that is less than 180° C. (e.g., 90-175° C., or lower). In a more general sense, any barrier layer 140 that can be formed at a temperature that does not cause the first photoresist pattern 130 to melt or otherwise deform can be used.

In some embodiments, barrier layer 140 may be deposited as a layer ranging from the thickness of a single constituent atom (i.e., a monolayer) to as thick a layer as desired for a given application. In one specific example embodiment, a given low-temperature material (e.g., oxide) may be deposited as a thin film in the range of about 20-160 Å (2-16 nm). In one or more embodiments, by increasing the thickness of the barrier layer 140 (e.g., 10-500 nm), smaller trenches, holes, and/or other etchable shapes/features may be formed in a given substrate 110 or other suitable surface. In some specific example instances, the thickness of barrier layer 140 may be less than or equal to about 400 Å, 300 Å, 200 Å, 160 Å, 130 Å, 80 Å, 70 Å, 50 Å, 25 Å, 15 Å, or 5 Å.

In any given embodiment, the thickness of the barrier layer 140 may be governed (at least in part) by the desired critical dimension of the feature (e.g., trench, hole, or other etchable shape/feature) to be formed in the substrate 110 or other suitable surface, which in turn is governed by the applicable process node. To further explain this concept, reference is now made to FIGS. 2B and 4B. In those Figures, the distance between photoresist features of first photoresist pattern 130 is represented by x, the thickness of the barrier layer 140 is represented by x', and the critical dimension of the feature to be formed (a trench in the particular non-limiting example of FIGS. 2B and 4B) is represented by x". In some embodiments, the thickness x' of the barrier layer 140 is generally less than one half of the distance x between photoresist features of first photoresist pattern 130. If the thickness x' of barrier layer 140 were to exceed one half of the distance x, then the gap between photoresist features of first photoresist pattern 130 would be completely filled by barrier layer 140, which would prevent or otherwise inhibit subsequent formation of a trench, hole, or other etchable shape/feature in the substrate 110 or other suitable surface below. Otherwise stated, for a given feature of a given critical dimension x", it generally may be desirable to dispose a barrier layer 140 of thickness x' according to the following relationship: x'<½x, where x' is the thickness of the barrier layer and x is the distance between photoresist features. However, in some cases, it may be desirable to implement a barrier layer 140 thicker than one-half the distance between photoresist features, for example, to form assist features and/or perform feature erasing during patterning.

The barrier layer 140 may be disposed by, for example, using conventional deposition processes capable of low-temperature operation such as chemical vapor deposition (CVD), atomic layer deposition (ALD), spin-on deposition (SOD), or physical vapor deposition (PVD). Alternate deposition techniques may be used as well, for instance, the barrier layer 140 may be thermally grown. As will be appreciated in light of this disclosure, any number of other suitable materials, geometries, and formation processes can be used to implement an embodiment of the present invention. In some instances, the barrier layer 140 may be substantially uniform over a given topography, while in other instances the barrier layer 140 may be non-uniform, with desired thicknesses applied to particular surfaces/topographical regions.

Figure 3A:
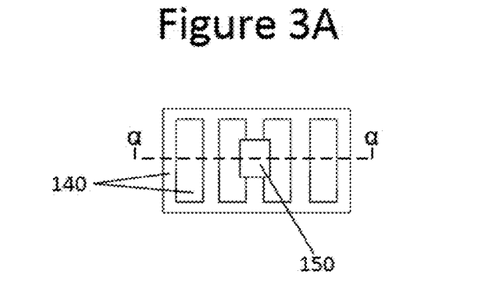
FIG. 3A illustrates a top-down view of the example integrated circuit of FIG. 2A after forming a second photoresist pattern thereon and configured in accordance with an embodiment of the present invention.
Figure 3B:
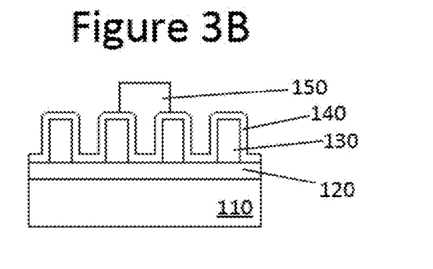
FIG. 3B illustrates a cross-section view of the example integrated circuit of FIG. 3A along dashed line α-α therein.

FIG. 3A illustrates a top-down view of the example integrated circuit of FIG. 2A after forming a second photoresist pattern 150 thereon and configured in accordance with an embodiment of the present invention. FIG. 3B illustrates a cross-section view of the example integrated circuit of FIG. 3A along dashed line α-α therein. As can be seen, a second photoresist pattern 150 may be patterned on at least a portion of the surface (or other exposed topography) resulting from barrier layer 140, first photoresist pattern 130, and/or (optional) anti-reflective coating 120.

Second photoresist pattern 150 may be any resist material (e.g., organic, inorganic, molecular, hybrid, etc.) suitable for patterning one or more lithographic features. Second photoresist pattern 150 may be made of any of the same (or different) photoresist materials as first photoresist pattern 130. Second photoresist pattern 150 may be of any desired dimensions, depending on the feature to be formed in substrate 110 or other suitable surface. In some embodiments, the resulting composite of the features of first photoresist pattern 130 and the features of second photoresist pattern 150 may define, for example, a complex two-dimensional structure to be formed in substrate 110 or other suitable surface. Second photoresist pattern 150 may be patterned using any suitable deposition method, as will be apparent in light of this disclosure. In some embodiments, the choice of material for second photoresist pattern 150 may be made, in part, based on optimally matching the topography on which it will be patterned (e.g., barrier layer, first photoresist pattern, etc.).

Figure 4A:
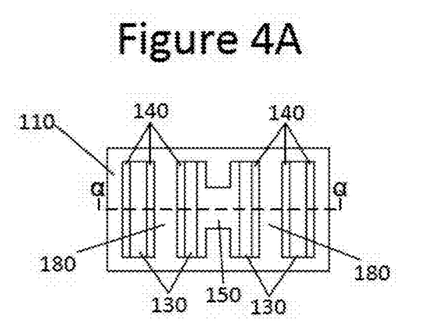
FIG. 4A illustrates a top-down view of the example integrated circuit of FIG. 3A after etching of the double pattern and configured in accordance with an embodiment of the present invention.
Figure 4B:
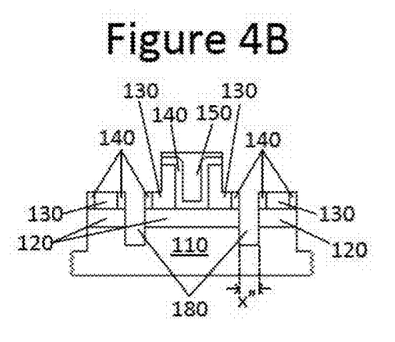
FIG. 4B illustrates a cross-section view of the example integrated circuit of FIG. 4A along dashed line α-α therein.

FIG. 4A illustrates a top-down view of the example integrated circuit of FIG. 3A after etching of the double pattern and configured in accordance with an embodiment of the present invention. FIG. 4B illustrates a cross-section view of the example integrated circuit of FIG. 4A along dashed line α-α therein. As can be seen, two features 180 (seen here as trenches, though other etchable shapes/features may be generated/printed, and the techniques disclosed herein are not constrained to any particular geometrical shape) have been defined in substrate 110. Anisotropic etching and/or isotropic etching may be implemented, in accordance with one or more embodiments of the present invention, as desired for achieving a given feature and/or etching directionality. In some specific example embodiments, anisotropic etching may be implemented to achieve a trench-like or hole-like feature having square corners/edges/walls, as may be desired for a given application.

To define a given pattern into substrate 110, a wet and/or dry etch process, for example, may be implemented with a given etch chemistry that may depend on factors such as the particular constituent material of substrate 110, pattern materials 130 and 150, and/or barrier layer 140, as well as their corresponding etch rates. In some specific example embodiments, a plasma etching process using an etchant such as, but not limited to, carbon tetrafluoride plasma may be used. Other suitable etchants will depend on a given application and will be apparent in light of this disclosure.

Figure 5A:
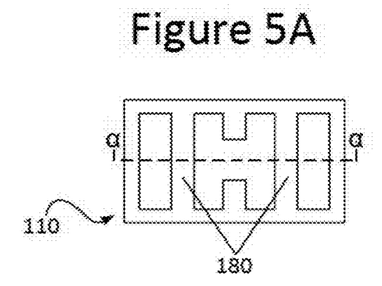
FIG. 5A illustrates a top-down view of the example integrated circuit of FIG. 4A after cleaning and configured in accordance with an embodiment of the present invention.
Figure 5B:
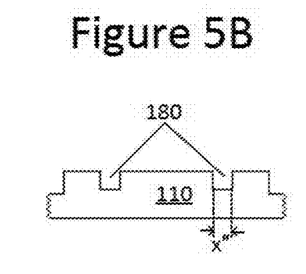
FIG. 5B illustrates a cross-section view of the example integrated circuit of FIG. 5A along dashed line α-α therein.

FIG. 5A illustrates a top-down view of the example integrated circuit of FIG. 4A after cleaning and configured in accordance with an embodiment of the present invention. FIG. 5B illustrates a cross-section view of the example integrated circuit of FIG. 5A along dashed line α-α therein. As can be seen, the cleaning process has removed the post-etch remains of the second photoresist pattern 150, the barrier layer 140, the first photoresist pattern 130, and the anti-reflective coating 120; only substrate 110 remains. As a result of the etching process (e.g., FIG. 4A/4B), substrate 110 has one or more features 180 formed therein, in accordance with an embodiment of the present invention. In the particular depicted example, two trench-like features 180 are formed in substrate 110, though any geometric shape may be patterned into substrate 110 or other suitable surface using the techniques of the present invention, as will be apparent in light of this disclosure.

The example integrated circuit of FIGS. 1A-5B is not necessarily drawn to scale or intended to limit the claimed invention in any way. For instance, while the various top-down and cross-section views generally indicate layered arrangements for etching of one or more trench-like features 180, any other geometric features (e.g., holes) may be generated/printed using the disclosed techniques and will be apparent in light of this disclosure. In short, FIGS. 1A-5B are provided merely to show one example of an etchable feature achievable via implementation of the disclosed techniques in accordance with various example embodiments of the present invention.

Figure 6:
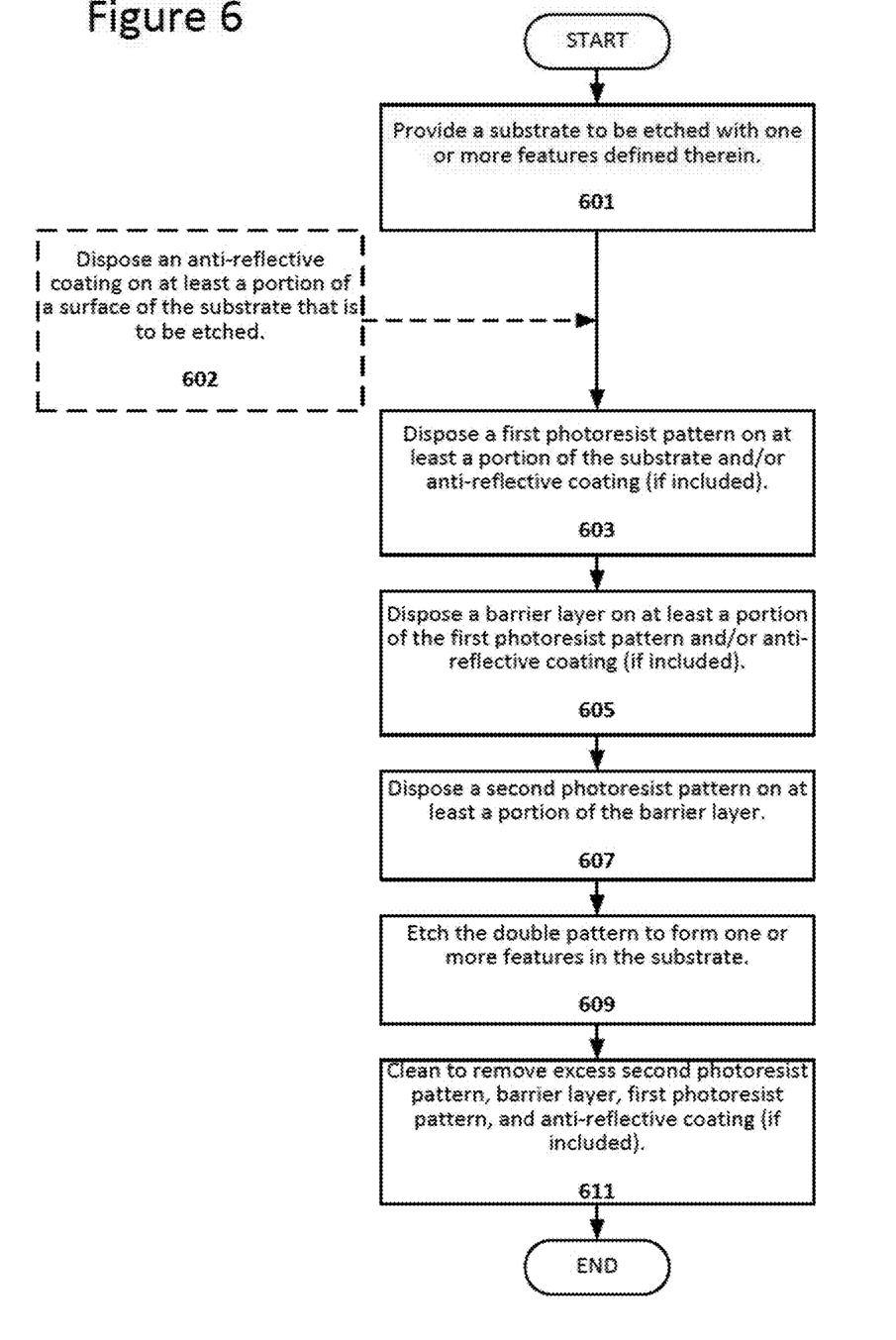
FIG. 6 is a flow diagram illustrating an example double patterning lithography method configured in accordance with an embodiment of the present invention.

FIG. 6 is a flow diagram illustrating an example double patterning lithography method configured in accordance with an embodiment of the present invention. As in block 601, provide a substrate to be etched with one or more features defined therein. As in optional block 602, optionally dispose an anti-reflective coating on at least a portion of a surface of the substrate that is to be etched. Application of an anti-reflective coating will depend, for example, on the given lithography process to be implemented for etching. As in block 603, dispose a first photoresist pattern on at least a portion of the substrate and/or anti-reflective coating (if included). As in block 605, dispose a barrier layer on at least a portion of the first photoresist pattern and/or anti-reflective coating (if included). As in block 607, dispose a second photoresist pattern on at least a portion of the barrier layer. As in block 609, etch the double pattern to form one or more features in the substrate. As in block 611, clean the substrate to remove the excess second photoresist pattern, barrier layer, first photoresist pattern, and anti-reflective coating (if included).

Experimental Data for Example Implementation

Figure 7A:
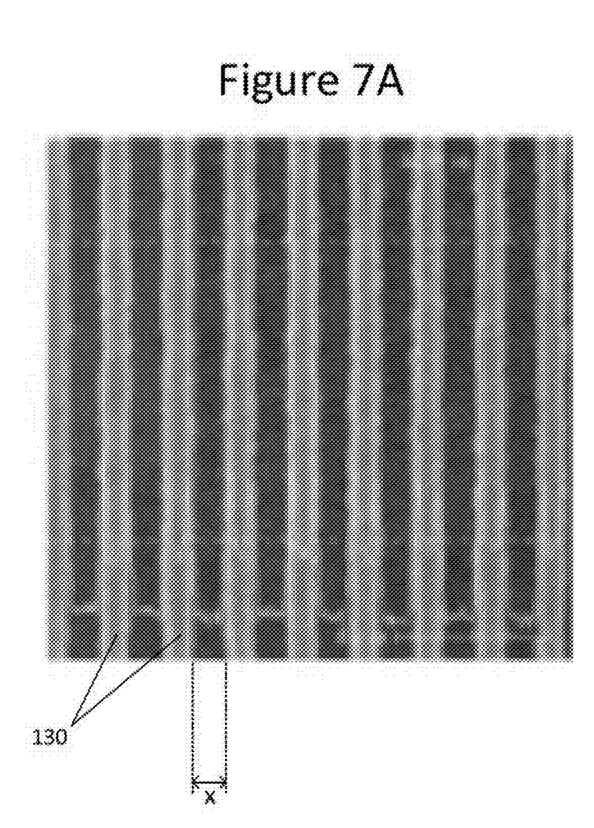
FIG. 7A illustrates a top-down SEM image taken after deposition of a first photoresist pattern on a substrate.

FIG. 7A illustrates a top-down SEM image taken after deposition of a first photoresist pattern 130 on a substrate, in accordance with an embodiment of the present invention. For comparison purposes, this point in the patterning process corresponds with, for example, FIGS. 1A and 1B discussed above. Here, the longitudinally-oriented darker bars represent the underlying substrate material and an optionally included anti-reflective coating, while the longitudinally-oriented lighter bars represent the first photoresist pattern 130 disposed thereon. In the specific depicted example, the distance (x) between photoresist features of the first photoresist pattern 130 is about 45 nm.

Figure 7B:
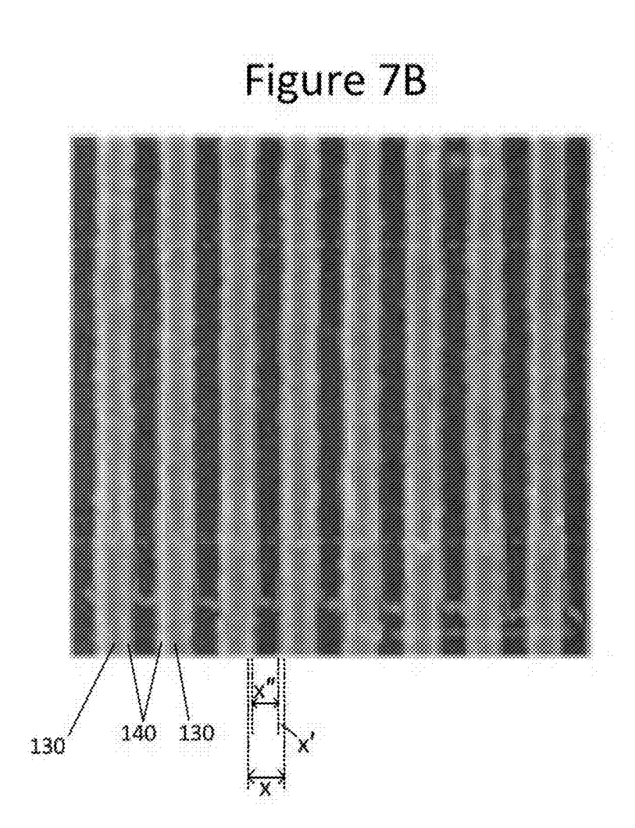
FIG. 7B illustrates a top-down SEM image taken after deposition of a barrier layer on the first photoresist pattern and substrate of FIG. 7A, in accordance with an embodiment of the present invention.

FIG. 7B illustrates a top-down SEM image taken after deposition of a barrier layer 140 on the first photoresist pattern 130 and substrate of FIG. 7A. For comparison purposes, this point in the patterning process corresponds with, for example, FIGS. 2A and 2B discussed above. Here, the longitudinally-oriented darker bars represent the underlying substrate material and optionally included anti-reflective coating with the barrier layer 140 (e.g., thin film oxide) disposed thereon, while the longitudinally-oriented lighter bars represent the first photoresist pattern 130 with the barrier layer 140 (e.g., thin film oxide) disposed thereon. In the specific depicted example, the distance (x) between features of the first photoresist pattern 130 remains about 45 nm (as in FIG. 7A), while the effective distance (x") (i.e., the critical dimension of the feature to be formed in the substrate) is about 30 nm, due to the thickness (x') of the barrier layer 140 applied to the first photoresist pattern 130 (and substrate and optionally included anti-reflective coating). In accordance with an embodiment of the present invention, the critical dimension (x") could be made smaller still by depositing a thicker layer of barrier layer 140; however, as discussed above with reference to FIGS. 2A and 2B, there may be a desired range for the thickness (x') of the barrier layer 140, as determined in part by the applicable process node and/or other manufacturing considerations (e.g., formation of assist features, feature erasing, etc.).

The techniques provided herein, in various embodiments, allow for processing at any process node, including the micrometer and nanometer ranges, such as 1 µm or 45 nm and beyond (e.g., 32 nm, 26 nm, 22 nm, 16 nm, 14 nm, and beyond) because the thickness (x') of the barrier layer 140 applied to first photoresist pattern 130 allows the features 180 (of a given geometry) formed from that photoresist pattern to be smaller than they otherwise would be. In this sense, the techniques provided herein allow the critical dimension (x") of a specific type of lithography equipment (e.g., 365 nm, 248 nm, 193 nm, 13 nm, etc.) to be smaller. More generally, the techniques disclosed herein will scale upwardly and/or downwardly with the wavelength used in a given lithographic process, in accordance with an example embodiment.

Figure 8A:
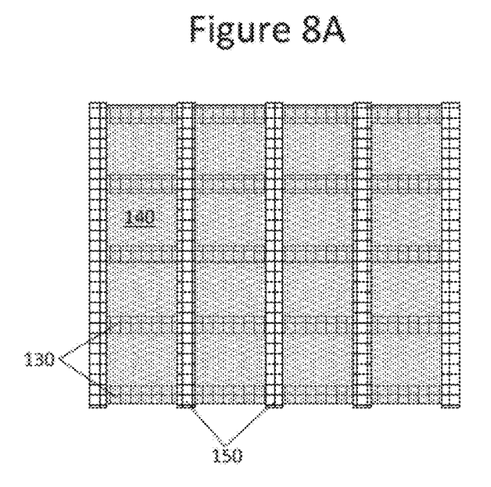
FIG. 8A is a top-down schematic view illustrating an example double-patterned feature configured in accordance with an embodiment of the present invention.
Figure 8B:
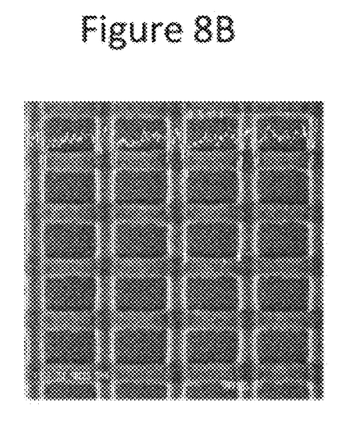
FIG. 8B illustrates a top-down SEM image demonstrating formation of the example double-patterned feature of FIG. 8A.

FIG. 8A is a top-down schematic view illustrating an example double-patterned feature configured in accordance with an embodiment of the present invention, and FIG. 8B illustrates a top-down SEM image demonstrating formation of the example double-patterned feature of FIG. 8A. As can be seen, a first photoresist pattern 130 was disposed on a substrate. Subsequently, a barrier layer 140 (e.g., low-temperature oxide) was disposed over the pattern 130 and substrate. Thereafter, a second photoresist pattern 150 was disposed over the topography resulting from pattern 130 and barrier layer 140 on the substrate. Upon etching the illustrated structure, a series of hole-like features having substantially right-angled corners would be formed in the substrate.

Figure 9A:
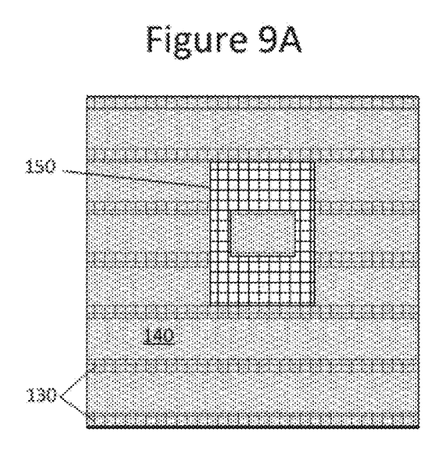
FIG. 9A is a top-down schematic view illustrating an example double-patterned feature configured in accordance with an embodiment of the present invention.
Figure 9B:
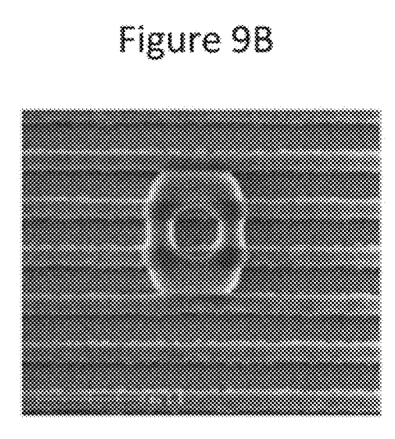
FIG. 9B illustrates a top-down SEM image demonstrating formation of the example double-patterned feature of FIG. 9A.

FIG. 9A is a top-down schematic view illustrating an example double-patterned feature configured in accordance with an embodiment of the present invention, and FIG. 9B illustrates a top-down SEM image demonstrating formation of the example double-patterned feature of FIG. 9A. As can be seen, a first photoresist pattern 130 was disposed on a substrate. Subsequently, a barrier layer 140 (e.g., low-temperature oxide) was disposed over the pattern 130 and substrate. Thereafter, a second photoresist pattern 150 was disposed over the topography resulting from pattern 130 and barrier layer 140 on the substrate. Upon etching the structure, a series of trench-like features and an isolated hole-like feature would be formed in the substrate.

Figure 10:
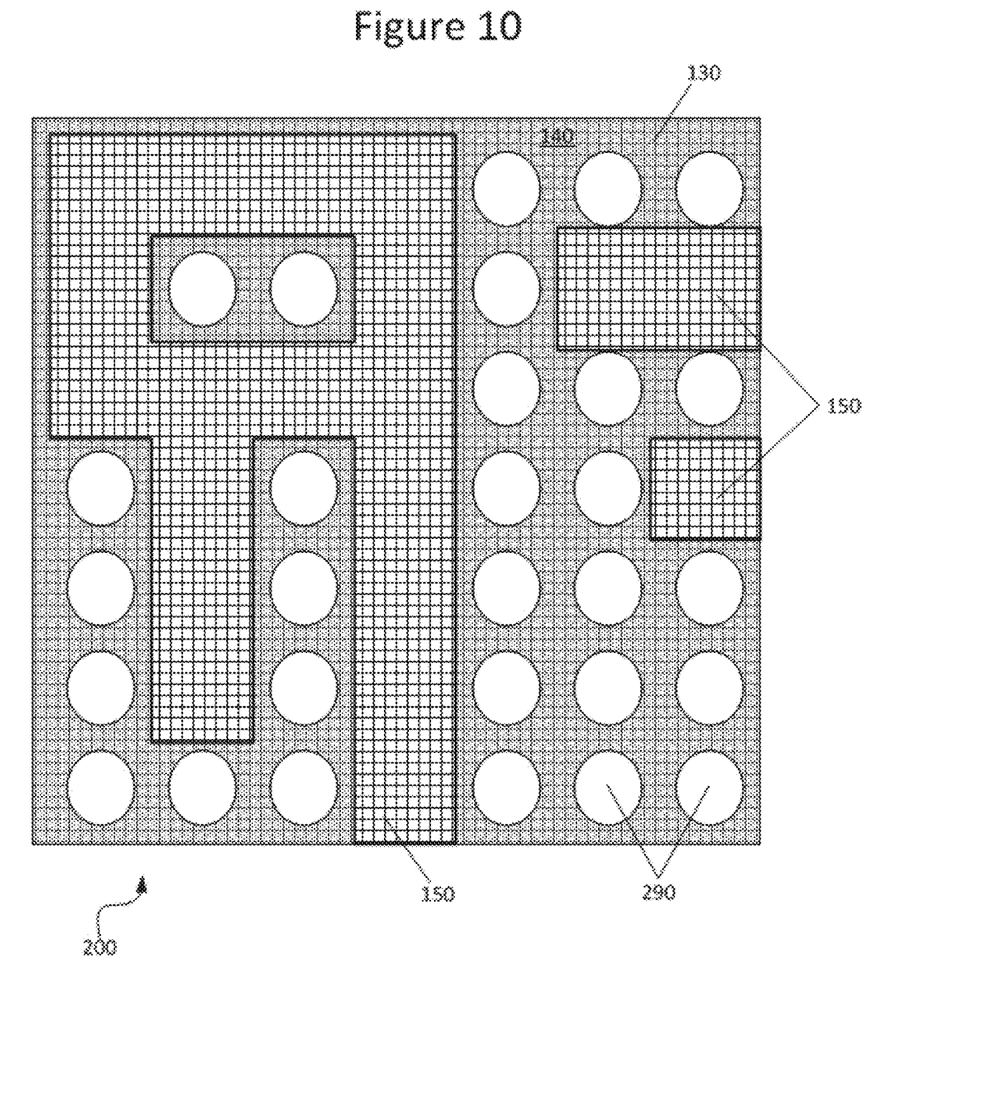
FIG. 10 is a top-down view illustrating an example random contact array configured in accordance with an embodiment of the present invention.

FIG. 10 is a top-down view illustrating an example random contact array 200 configured in accordance with an embodiment of the present invention. As can be seen, a first photoresist pattern 130 was disposed on a substrate to form an array of contact pads 290. A barrier layer 140 was disposed over the first photoresist pattern 130. A second photoresist pattern 150 was disposed over certain portions of the array of contact pads 290. As is evident, second photoresist pattern 150 breaks the resulting trenches into different shapes (e.g., hole in upper left corner).

The various schematic diagrams and SEM images of FIGS. 8A-10 effectively show that the techniques of the present invention may be implemented in a variety of ways, in accordance with an embodiment of the present invention. The specific example embodiments provided in the Figures are not intended to limit the claimed invention; rather, numerous other suitable multi-pattern designs and structures may be produced in accordance with an embodiment of the present invention and will be apparent in light of this disclosure.

Tuning the Etch Process

In some embodiments of the present invention, a two-dimensional pattern, for example, may be generated/printed such that the impact of a second lithography step on the trench, hole, or other etchable shape/feature obtained during a first lithography step (e.g., via the first photoresist pattern) is minimized or eliminated. In some such cases, this may be achieved by taking advantage of etch selectivity between, for example, a carbon-based photoresist pattern (e.g., the second photoresist pattern) and a low-temperature oxide (e.g., the barrier layer on the first photoresist pattern).

Referring back to FIGS. 4A and 4B, for example, after depositing a first photoresist pattern 130, a barrier layer 140 (e.g., low-temperature oxide), and a second photoresist pattern 150, the substrate 110 is ready to be etched. The etch process itself may be tuned to independently control the various dimensions (e.g., one, two, or three dimensions) of a given photoresist pattern 130. For example, the etch process may be adjusted to independently alter each edge of a given polygonal feature. In some cases, the etch process may be adjusted to selectively shrink portions of a given pattern. More generally, tuning of the etch process may be done with any geometric pattern (e.g., vias, contact holes, trenches, etc.) to be formed in accordance with embodiments of the present invention.

In some cases, the etch process may be designed to take advantage of the fact that the overall photoresist pattern is constructed from multiple (e.g., two) different materials which may be etched at different rates. In some example instances, first photoresist pattern 130, which is encapsulated in a barrier layer 140 (e.g., a low-temperature oxide), may have a different etch rate as compared to that of the second photoresist pattern 150, which may not be so encapsulated. In some such instances, the etch process may be designed to exploit this difference in etch rate. In some instances, the first and second photoresist patterns 130 and 150 may be etched with different chemistries and/or at different times. For example, changes in plasma species, power, temperature, and/or time may be made to tune the etch process, in some embodiments. As a result, the second photoresist pattern 150 may be grown/shrunk without affecting the first photoresist pattern 130, thus providing an advantage over conventional techniques. For example, a more aggressive etch of second photoresist pattern 150 may govern the distance between, for example, trench-like features 180 in a given substrate 110.

Figure 11A:
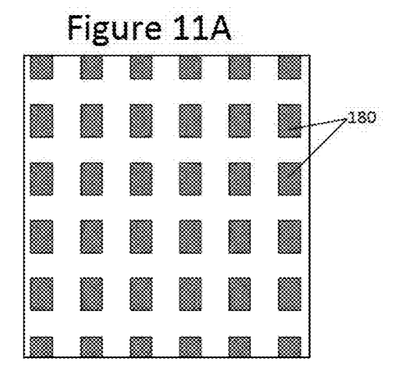
FIG. 11A is a top-down schematic view illustrating an example double-patterned feature configured in accordance with an embodiment of the present invention.
Figure 11B:
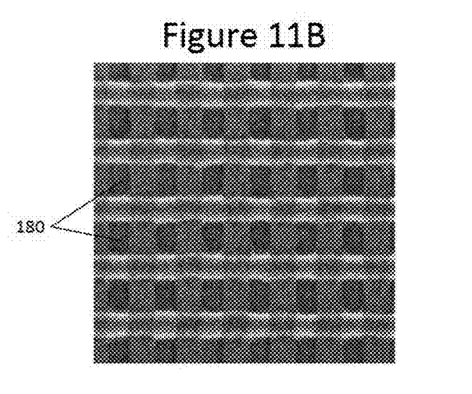
FIG. 11B illustrates a top-down SEM image demonstrating formation of the example double-patterned feature of FIG. 11A, in accordance with an embodiment of the present invention.

FIG. 11A is a top-down schematic view illustrating an example double-patterned feature configured in accordance with an embodiment of the present invention. FIG. 11B illustrates a top-down SEM image demonstrating formation of the example double-patterned feature of FIG. 11A, in accordance with an embodiment of the present invention. As can be seen, upon etching, a series of hole-like features 180 having substantially right-angled corners would be formed in the substrate. Here, these example patterned features 180 are longitudinally biased.

Figure 11C:
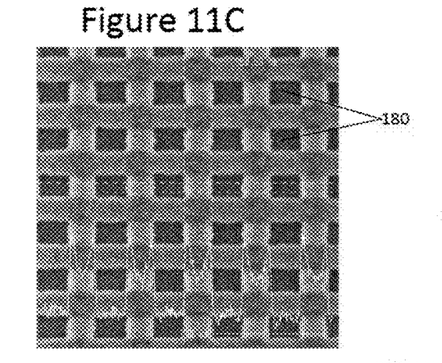
FIGS. 11C, 11D, and 11E illustrate top-down SEM images demonstrating alternative formations of the example double-patterned feature of FIG. 11A, in accordance with other respective embodiments of the present invention.
Figure 11D:
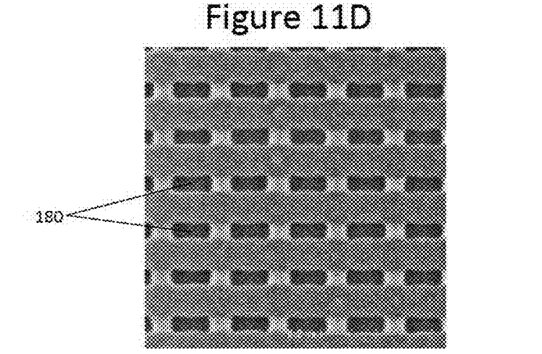
Figure 11E:
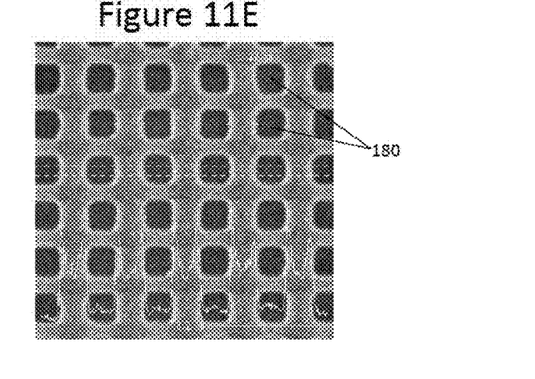

FIGS. 11C, 11D, and 11E illustrate top-down SEM images demonstrating alternative formations of the example double-patterned feature of FIG. 11A, in accordance with other respective embodiments of the present invention. These figures demonstrate that the aspect ratio of the hole-like features 180 may be adjusted through the tuning of the etch process, as discussed above. The photoresist patterning implemented in each of the samples of FIGS. 11B-11E was identical for the various substrates (i.e., the pitch/spacing between each portion of the photoresist pattern remained constant), the only differences being in the etch process itself. In each of the samples of FIGS. 11C, 11D, and 11E, etch processes which took advantage of the fact that the overall photoresist pattern (i.e., first photoresist pattern plus the second photoresist pattern) was constructed from two different materials having dissimilar etch rates were employed. Independent control over the aspect ratio of the photoresist patterns was achieved with changes to the etch process (e.g., isotropic etching may achieve changes evenly in all directions, while anisotropic etching may achieve changes in particular directions). As can be seen in the provided examples, features 180 in FIGS. 11C and 11D are more transversely biased as compared to the longitudinally biased features 180 in FIG. 11B, while features 180 in FIG. 11E are substantially more square (1:1 ratio) than features 180 in FIG. 11B.

Hole-like features 180 having substantially square (i.e., right angle) corners, edges, and/or walls, such as those that may be formed in accordance with one or more embodiments of the present invention, are typically unachievable with conventional single-exposure lithography processes, which instead yield features with rounded edges/corners as a result of the wavelength of the photolithographic light used. In some embodiments of the present invention, filling a feature 180 having substantially right-angled corners/edges with a conductive metal permits the metal filling to have a greater contact surface area and thus a lower resistance. Conversely, conventional techniques resulting in rounded corners/edges/walls provide less available metal contact surface area and thus increase resistance in a given system.

In one or more embodiments of the present invention, the critical dimension of a given feature 180 to be defined in a substrate 110 (e.g., semiconductor wafer) may be altered (e.g., made smaller) by: (1) generating/printing a smaller photoresist pattern; (2) depositing a barrier layer (e.g., low-temperature oxide) of greater thickness on a photoresist pattern; and/or (3) adjusting the etch process (e.g., etch chemistry).

In various embodiments, the disclosed techniques may be used to implement various integrated circuit structures/devices that may be manufactured as discrete components or on-chip and at, for example, the deep-submicron process levels/nodes, including the 45 nm process node and beyond (e.g., 32 nm, 26 nm, 22 nm, 16 nm, 14 nm, and beyond). Such structures/devices can be used in any number of electronic systems, as will be apparent in light of this disclosure.

Example System

Figure 12:
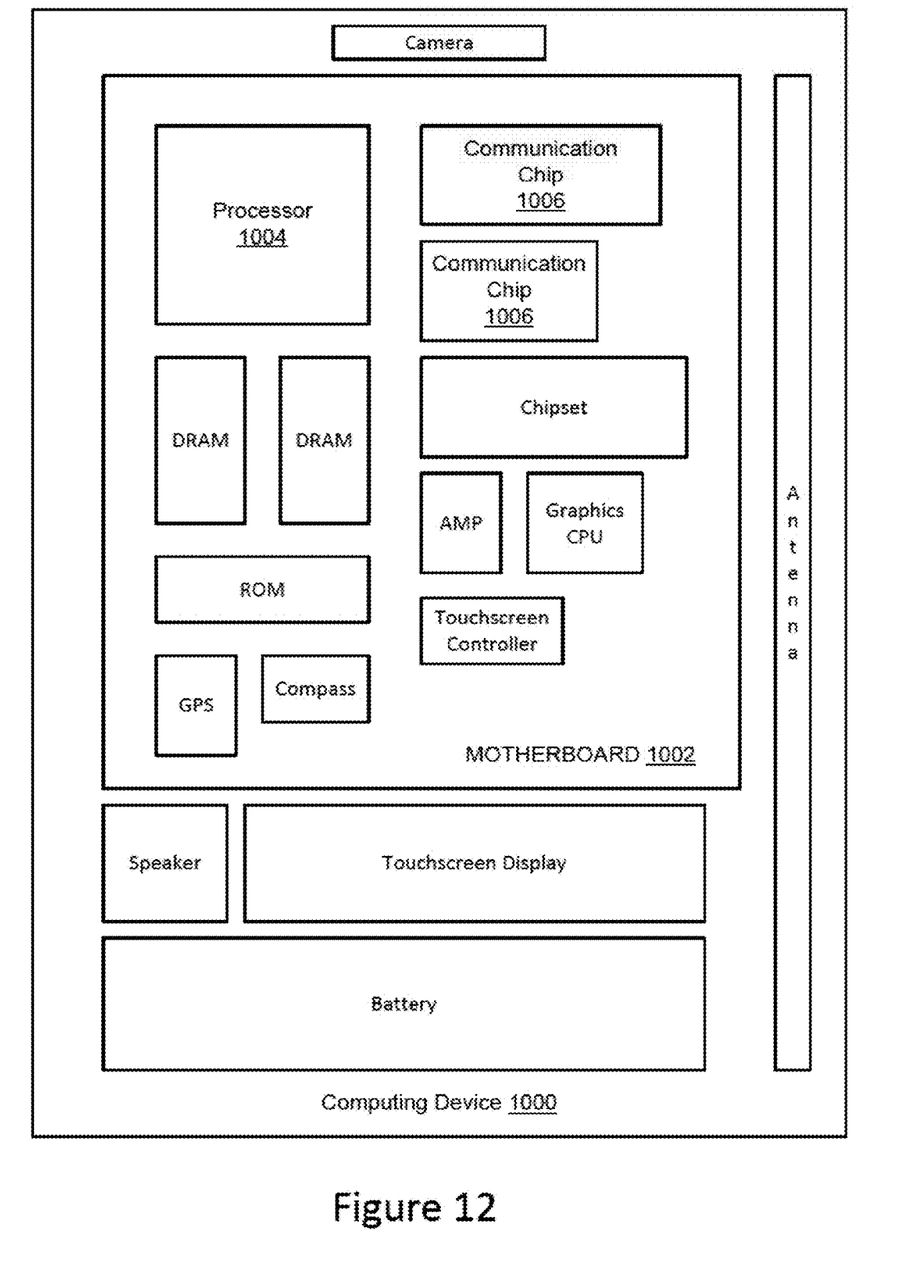
FIG. 12 illustrates a computing system implemented with one or more integrated circuit structures configured and/or otherwise fabricated in accordance with an example embodiment of the present invention.

FIG. 12 illustrates a computing system 1000 implemented with one or more integrated circuit structures configured and/or otherwise fabricated in accordance with an example embodiment of the present invention. As can be seen, the computing system 1000 houses a motherboard 1002. The motherboard 1002 may include a number of components, including but not limited to a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board or a daughterboard mounted on a main board or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures formed as described herein. These integrated circuit structures can be used, for instance, to implement an on-board processor cache or memory array or other circuit feature. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments of the present invention, the integrated circuit die of the processor includes onboard memory circuitry that is implemented with one or more integrated circuit structures formed as described herein. The term "processor" may refer to any device or portion of a device that processes, for instance, electronic data from registers and/or memory to transform that electronic data into other electronic data that may be stored in registers and/or memory.

The communication chip 1006 may also include an integrated circuit die packaged within the communication chip 1006. In accordance with some such example embodiments, the integrated circuit die of the communication chip includes one or more devices implemented with one or more integrated circuit structures formed as described herein (e.g., on-chip processor or memory). As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 1000 may be any other electronic device that processes data or employs integrated circuit features formed as described herein (e.g., trenches, vias, conductors, etc.).

Numerous embodiments will be apparent, and features described herein can be combined in any number of configurations. One example embodiment of the present invention provides a method that includes forming an integrated circuit structure comprising a substrate, a first photoresist pattern disposed on at least a portion of the substrate, a barrier layer disposed on at least a portion of the first photoresist pattern, and a second photoresist pattern disposed on at least a portion of the barrier layer. The method further includes etching the structure to define a feature in the substrate, wherein the effective etch rate of the combined first photoresist pattern and barrier layer is different from the effective etch rate of the second photoresist pattern. In some cases, the method includes cleaning the substrate after etching to remove the second photoresist pattern, the barrier layer, and the first photoresist pattern therefrom. In some cases, the structure further includes an anti-reflective coating disposed on at least a portion of the substrate prior to disposing the first photoresist pattern. In such cases, the first photoresist pattern is disposed on at least a portion of the anti-reflective coating, and the substrate is cleaned after etching to remove the second photoresist pattern, the barrier layer, the first photoresist pattern, and the anti-reflective coating therefrom. In some cases, the first and second photoresist patterns comprise the same material. In other cases, however, they may comprise different materials. In some cases, the barrier layer has a maximum temperature at which it is disposed and the first photoresist pattern comprises a material having a melting point that is higher than the maximum temperature. In some cases, the barrier layer is disposed in a substantially uniform layer having a thickness that is less than one half of a distance between adjacent features of the first photoresist pattern. In other cases, the barrier layer is disposed with a non-uniform layer thickness. In some cases, the barrier layer comprises an oxide or nitride. In some cases, the barrier layer is disposed at a temperature less than a melting point of the first photoresist pattern. In some cases, the barrier layer passivates and protects the first photoresist pattern from chemicals used in subsequent processing of the method. In some cases, the barrier layer provides a barrier to photoresist that can be double exposed. In some cases, the barrier layer does not significantly alter the first photoresist pattern with respect to its profile, sidewall angle, footing, or top-rounding. In some cases, the barrier layer is chemically inert and does not interact with the second photoresist pattern. In some cases, the barrier layer is chemically compatible with the second photoresist pattern. In some cases, protection provided the barrier layer is supplemented with other protection processes including at least one of chemical treatment, physical layering, ion implantation, and plasma treatment. In some cases, the etching is tuned to control pattern feature dimensions in transverse and longitudinal directions independently. In some cases, the first and second photoresist patterns are etched with different chemistries and at different times. In some cases, the second photoresist pattern is shrunk or grown without affecting the first photoresist pattern. Numerous variations will be apparent. For instance, another embodiment provides an integrated circuit fabricated using the methodology described in this paragraph. Another embodiment provides an electronic device comprising one or more integrated circuits fabricated using the methodology described in this paragraph. In some such cases, the device comprises at least one of a memory circuit, a communication chip, a processor, and/or a computing system.

Another embodiment of the present invention provides a method that includes forming an integrated circuit structure comprising a substrate, a first photoresist pattern disposed on at least a portion of the substrate, and a barrier layer disposed on at least a portion of the first photoresist pattern, wherein the barrier layer is disposed at a temperature less than a melting point of the first photoresist pattern and passivates the first photoresist pattern. The structure further includes a second photoresist pattern disposed on at least a portion of the barrier layer, wherein the barrier layer is chemically inert and does not interact with the second photoresist pattern. The method continues with etching the structure to define a feature in the substrate, wherein the effective etch rate of the combined first photoresist pattern and barrier layer is different from the effective etch rate of the second photoresist pattern, and the etching is tuned to control pattern feature dimensions in transverse and longitudinal directions independently. The method further includes cleaning the substrate after etching to remove the second photoresist pattern, the barrier layer, and the first photoresist pattern therefrom.

Another embodiment of the present invention provides an integrated circuit, comprising a substrate having one or more features formed thereon and a plurality of transistor devices operatively coupled in a circuit by at least one of the one or more features. The one or more features are formed by the following process depositing a first photoresist pattern on at least a portion of the substrate, depositing a barrier layer on at least a portion of the first photoresist pattern, depositing a second photoresist pattern on at least a portion of the barrier layer, and etching the structure to define a feature in the substrate, wherein the effective etch rate of the combined first photoresist pattern and barrier layer is different from the effective etch rate of the second photoresist pattern. Another embodiment of the present invention includes an electronic device comprising one or more of the integrated circuit as variously defined in this paragraph. In some example cases, the electronic device comprises at least one of a memory circuit, a communication chip, a processor, and/or a computing system.

The foregoing description of example embodiments of the invention has been presented for the purposes of illustration and description. It is not intended to be exhaustive or to limit the invention to the precise forms disclosed. Many modifications and variations are possible in light of this disclosure. It is intended that the scope of the invention be limited not by this detailed description, but rather by the claims appended hereto.

What is claimed is:

1. A method, comprising:
   forming an integrated circuit structure comprising:
   a substrate;
   a first photoresist pattern disposed on at least a portion of the substrate;
   a chemically inert barrier layer disposed on at least a portion of the first photoresist pattern, chemically inert the barrier layer comprising an inorganic material comprising an oxide, nitride, or carbide; and
a second photoresist pattern disposed on at least a portion of the chemically inert barrier layer; and
etching the structure to define a feature in the substrate, wherein the effective etch rate of the combined first photoresist pattern and the chemically inert barrier layer is different from the effective etch rate of the second photoresist pattern.

2. The method of claim 1 further comprising cleaning the substrate to remove the second photoresist pattern, the barrier layer, and the first photoresist pattern therefrom.

3. The method of claim 1, wherein:
the structure further comprises an anti-reflective coating disposed on at least a portion of the substrate prior to disposing the first photoresist pattern;
the first photoresist pattern is disposed on at least a portion of the anti-reflective coating; and
the substrate is cleaned to remove the second photoresist pattern, the chemically inert barrier layer, the first photoresist pattern, and the anti-reflective coating therefrom.

4. The method of claim 1, wherein the first and second photoresist patterns comprise the same material.

5. The method of claim 1, wherein the chemically inert barrier layer has a maximum temperature at which it is disposed and the first photoresist pattern comprises a material having a melting point that is higher than the maximum temperature.

6. The method of claim 1, wherein the chemically inert barrier layer is disposed in a substantially uniform layer having a thickness that is less than one half of a distance between adjacent features of the first photoresist pattern.

7. The method of claim 1, wherein the chemically inert barrier layer is disposed with a non-uniform layer thickness.

8. The method of claim 1, wherein the chemically inert barrier layer protects the first photoresist pattern against chemical attack from one or more of water, ethyl lactate ($C_5H_{10}O_3$), propylene glycol methyl ether acetate (PGMEA) ($C_6H_{12}O_3$), propylene glycol monomethyl ether (PGME) ($C_4H_{10}O_2$), cyclohexanone ($C_6H_{10}O$), hexamethyldisalizane (HMDS) (($CH_3)_3Si$—NH—$Si(CH_3)_3$),and tetra-methyl ammonium hydroxide (TMAH) (($CH_3)_4NOH$).

9. The method of claim 1, wherein the chemically inert barrier layer is disposed at a temperature less than a melting point of the first photoresist pattern.

10. The method of claim 1, wherein the chemically inert barrier layer passivates and protects the first photoresist pattern from chemicals used in subsequent processing of the method.

11. The method of claim 1, wherein the chemically inert barrier layer provides a barrier to the first photoresist pattern that can be double exposed.

12. The method of claim 1, wherein the chemically inert barrier layer does not significantly alter the first photoresist pattern with respect to at least one of its profile, sidewall angle, footing, and top-rounding.

13. The method of claim 1, wherein the chemically inert barrier layer has a thickness less than or equal to about 400 Å.

14. The method of claim 1, wherein the chemically inert barrier layer is silicon oxide, silicon dioxide, germanium oxide, silicon-germanium oxide, a III-V oxide, or titanium oxide.

15. The method of claim 1, wherein protection provided by the chemically inert barrier layer is supplemented with other protection processes including at least one of chemical treatment, physical layering, ion implantation, and plasma treatment.

16. The method of claim 1, wherein the etching is tuned to control pattern feature dimensions in transverse and longitudinal directions independently.

17. The method of claim 1, wherein the first and second photoresist patterns are etched with different chemistries and at different times.

18. The method of claim 1, wherein the second photoresist pattern is shrunk or grown without affecting the first photoresist pattern.

19. An integrated circuit fabricated using the method of claim 1.

20. An electronic device comprising one or more integrated circuits fabricated using the method of claim 1.

21. The electronic device of claim 20, wherein the device comprises at least one of a memory circuit, a communication chip, a processor, and a computing system.

22. A method, comprising:
forming an integrated circuit structure comprising:
a substrate;
a first photoresist pattern disposed on at least a portion of the substrate;
a chemically inert barrier layer disposed on at least a portion of the first photoresist pattern, the chemically inert barrier layer comprising an inorganic material comprising an oxide, nitride, or carbide, wherein the chemically inert barrier layer is disposed at a temperature less than a melting point of the first photoresist pattern and passivates the first photoresist pattern; and
a second photoresist pattern disposed on at least a portion of the chemically inert barrier layer, wherein the chemically inert barrier layer does not react with the second photoresist pattern;
etching the structure to define a feature in the substrate, wherein the effective etch rate of the combined first photoresist pattern and the chemically inert barrier layer is different from the effective etch rate of the second photoresist pattern, and the etching is tuned to control pattern feature dimensions in transverse and longitudinal directions independently; and
cleaning the substrate to remove the second photoresist pattern, the chemically inert barrier layer, and the first photoresist pattern therefrom.

23. An integrated circuit, comprising:
a substrate having one or more features formed thereon by the following process:
depositing a first photoresist pattern on at least a portion of the substrate;
depositing a chemically inert barrier layer on at least a portion of the first photoresist pattern, the chemically inert barrier layer comprising an inorganic material comprising an oxide, nitride, or carbide;
depositing a second photoresist pattern on at least a portion of the chemically inert barrier layer; and
etching to define the one or more features in the substrate, wherein the effective etch rate of the combined first photoresist pattern and the chemically inert barrier layer is different from the effective etch rate of the second photoresist pattern; and
a plurality of transistor devices operatively coupled in a circuit by at least one of the one or more features.

24. An electronic device comprising one or more the integrated circuit of claim 23.

25. The electronic device of claim 24, wherein the electronic device comprises at least one of a memory circuit, a communication chip, a processor, and a computing system.

* * * * *

UNITED STATES PATENT AND TRADEMARK OFFICE
CERTIFICATE OF CORRECTION

PATENT NO. : 9,142,421 B2  
APPLICATION NO. : 13/976090  
DATED : September 22, 2015  
INVENTOR(S) : Charles H. Wallace et al.

Page 1 of 1

It is certified that error appears in the above-identified patent and that said Letters Patent is hereby corrected as shown below:

In the Claims:

In column 14, line 67, please add "the" before "chemically";

In column 15, line 1, please delete "the" after "inert"; and

In column 15, line 11, please add "chemically inert" before "barrier.".

Signed and Sealed this  
Fifteenth Day of March, 2016

Michelle K. Lee  
*Director of the United States Patent and Trademark Office*